(12) United States Patent
Saitoh et al.

(10) Patent No.: US 6,229,220 B1
(45) Date of Patent: *May 8, 2001

(54) BUMP STRUCTURE, BUMP FORMING METHOD AND PACKAGE CONNECTING BODY

(75) Inventors: Kazuto Saitoh, Ohmihachiman; Reijiro Shoji, Kyoto, both of (JP)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/712,542

(22) Filed: Sep. 11, 1996

(30) Foreign Application Priority Data

Jun. 27, 1995 (JP) .................................... 7-249627

(51) Int. Cl.$^7$ ............................ H01L 23/48; H01L 23/52; H01L 29/40
(52) U.S. Cl. .......................... 257/780; 257/738; 257/778; 257/779
(58) Field of Search .................................. 257/738, 778, 257/779, 780, 781

(56) References Cited

U.S. PATENT DOCUMENTS

| 3,900,153 | * | 8/1975 | Beerwerth et al. | 228/246 |
| 4,914,814 | * | 4/1990 | Behun et al. | 29/843 |
| 4,950,623 | * | 8/1990 | Dishon | 438/614 |
| 5,308,578 | * | 5/1994 | Wong | 420/558 |
| 5,329,423 | * | 7/1994 | Scholz | 361/760 |
| 5,466,635 |   | 11/1995 | Lynch et al. | 438/614 |
| 5,598,036 | * | 1/1997 | Ho | 257/738 |
| 5,600,180 | * | 2/1997 | Kusaka et al. | 257/692 |
| 5,640,048 | * | 6/1997 | Selna | 257/738 |
| 5,656,858 | * | 8/1997 | Kondo et al. | 257/737 |

FOREIGN PATENT DOCUMENTS

| 57-106057 | 7/1982 | (JP) . |
| 59-058843 | 4/1984 | (JP) . |
| 60-068637 | 4/1985 | (JP) . |
| 6-117346 | 11/1985 | (JP) . |
| 62-234352 | 10/1987 | (JP) . |
| 5-259167 | 10/1993 | (JP) . |
| 6-077229 | 3/1994 | (JP) . |

OTHER PUBLICATIONS

Lawrence H. van Vlack, Elements of Materials Science and Engineering, p. 302, Dec. 1975.*
Editor Robert C. Weast, Ph.D., Handbook of Chemistry and Physics, 57th Edition, pp. B–1, F–171 and F–173, Nov. 1976.*

* cited by examiner

*Primary Examiner*—Jerome Jackson, Jr.
*Assistant Examiner*—Allan R. Wilson

(57) ABSTRACT

To provide a bump structure for soldering by forming a solder layer on the chip surface while keeping the space between a package substrate and a semiconductor chip large. Form a bump structured in double layers at a chip 1 and connect it to an electrode 11 of a package substrate 10 by soldering. The lower layer 3a in the double-layer structure does not fuse in soldering, and a definite distance between the substrate and the chip can be maintained. The upper layer 3b actually fuses in soldering and operates to electrically connect the bump to the electrode on the package substrate. The melting point of the lower layer is preferably at least 20° C. higher than that of the upper layer.

17 Claims, 4 Drawing Sheets

[Figure 3]
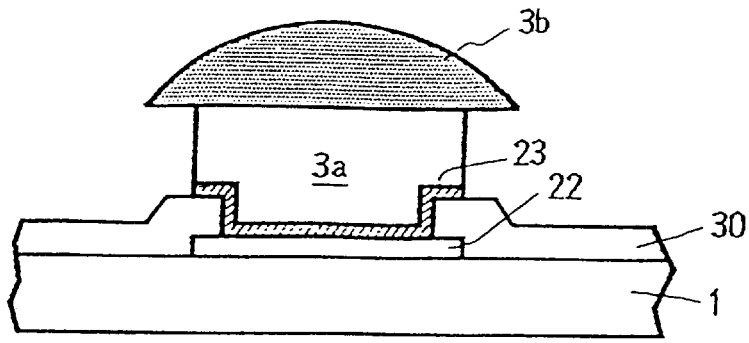
[Figure 4]
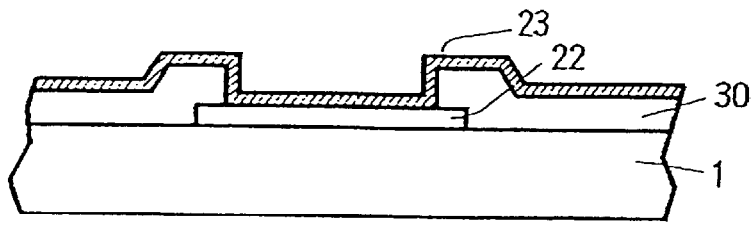
[Figure 5]
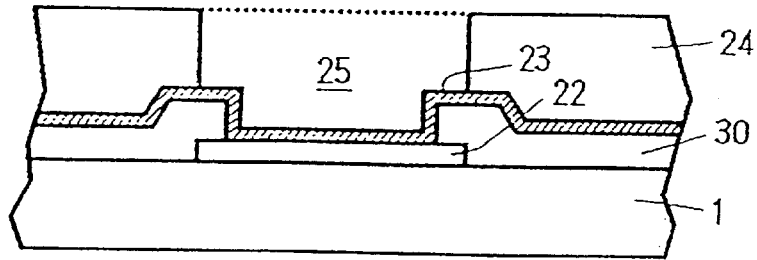
[Figure 6]
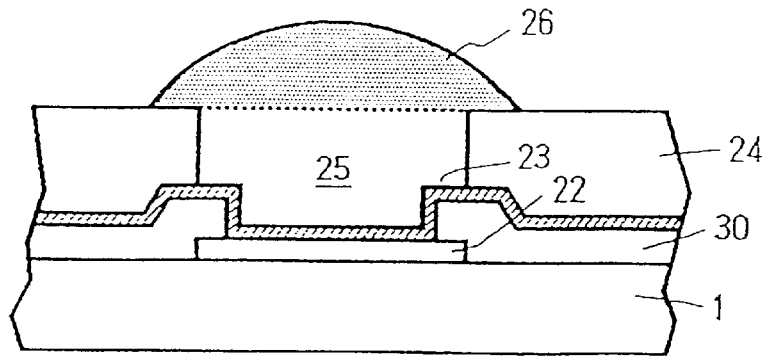

[Figure 7]
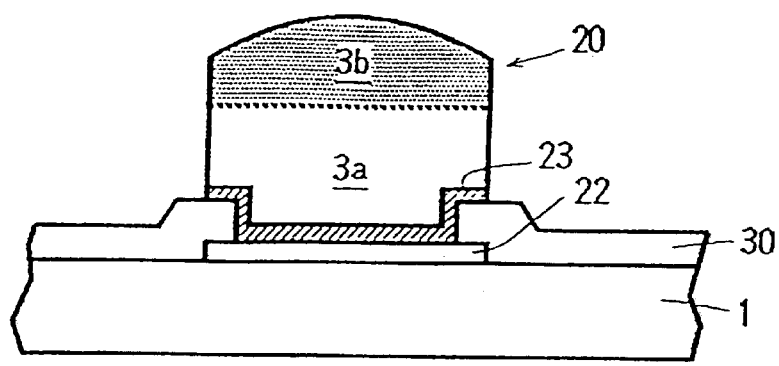
[Figure 8]
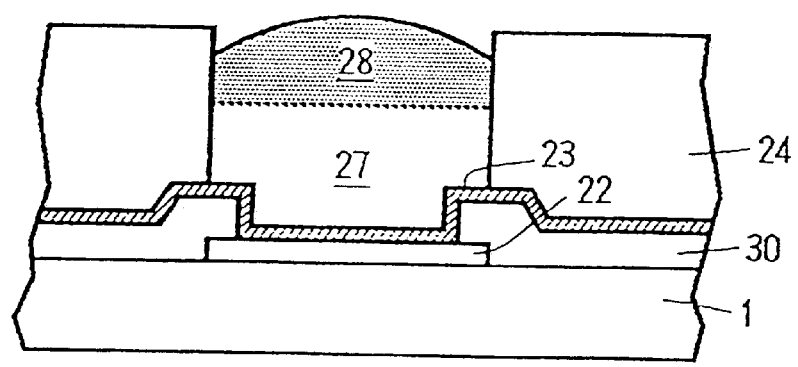

BUMP STRUCTURE, BUMP FORMING METHOD AND PACKAGE CONNECTING BODY

FIELD OF THE INVENTION

The invention of the present application refers to the structure of a solder bump for electrically connecting a semiconductor chip to a package substrate and a forming method thereof, and more particularly, to a structure in which a solder bump is formed only on the surface of a semiconductor chip, thereby improving the life of the connection, or the like.

BACKGROUND ART

A semiconductor chip with a circuit element formed thereon is packaged on a package substrate for electric connection between chips. At that time, it is necessary that an electrode of a semiconductor chip be electrically connected to an electrode formed on a package substrate. As a method for this purpose, the flip chip technique as shown in FIGS. 1a and 1b generally used. In this technique, a solder ball 3 is formed on the external output terminal of a chip 1, separately, a solder bump 12 is formed on wiring 11 of a package substrate 10 and both of them are connected by reflow. Here, the solder ball 3 on the semiconductor chip 1 is made of a solder of a higher melting point than that of a solder related to the solder bump 12 and does not fuse by reflow. For example, the solder bump 12 is made of eutectic solder (63 wt. % tin/37 wt. % lead), whereas the solder ball 3 made of solder (97 wt. % tin/3 wt. % lead) having a higher melting point. In addition, wiring 11 on the package substrate 10 does not fuse even after reflow because of being generally made of gold or copper. A multi-layered printed board, such as an SLC (Surface Laminated Circuitry) substrate formed by the buildup process, is often used as the package substrate 10.

The flip-chip technique requires that a solder 12 be used to form a connection to the package substrate. This connection is needed because the space H between the semiconductor chip 1 and the package substrate 10 needs to be maintained.

The space H is a parameter for the connection life of a product. That is, the connection life Nf is given by Nf=M•H/(Δα•l•ΔT), where M is the connection constant dependent on a connection material; Δα is the difference in thermal expansion factor between a semiconductor chip and a package substrate; l is the distance from the center of a semiconductor chip to a bump at the outermost circumference; and ΔT is the temperature range in a heat cycle. When all of the factors except H are balanced, the connection life depends upon the space H between the semiconductor chip and the package substrate after connection. Thus, forming solder bumps 12 for connection on the semiconductor substrate is needed to increase the value of H.

However, forming solder bumps for connection on the surface of the semiconductor substrate is problematic. There is a need for forming a solder ball 3 on the surface of the chip and a solder bump 12 on the surface of the package substrate, but supplying solder at a plurality of spots to achieve a single electric connection in this manner complicates the process and accordingly presents a problem from the standpoint of productivity. In addition, forming such a solder bump 12 obstructs the pitch of a pad to be miniaturized, thereby making it difficult to implement a higher-density package substrate. Furthermore, a solder bump is generally formed by the screen printing process, but a mask used in this process is expensive and a change in the specification thereof is difficult.

A relevant technique, is disclosed in Published Unexamined Patent Application No. 3-62926. In that application, a solder bump is structured by forming a high-melting-point solder layer on an electrode which is formed on the substrate, with a low-melting-point solder layer thereon. The high-melting-point solder layer never fuses in soldering, therefore this structure has an advantage in that a definite space H can be maintained. However, since the thickness of the superficial low-melting-point solder layer is small, a high-melting-point solder layer has to be formed thickly, which is difficult in view of process. In addition, according to the structure disclosed, the shape of a mushroom having a wide cap requires a large pitch between the solder bumps, which clearly hinders a high-density packaging.

Also, Published Unexamined Patent Application No. 5-243233 discloses a bump structured by forming a lower layer of copper and coating the portion exposed above the insulating layer with an upper layer made of gold. However, the gold coating in this invention is applied to provide stability for the copper underlayer, but does not aim at prolonging the connection life and promoting the productivity of forming the solder bump in a flip chip connection.

It is one objective of the present invention to perform soldering by forming a solder layer only on the surface of a semiconductor chip without forming a solder bump on the surface of a package substrate while keeping the space H between the package substrate and the semiconductor chip greater than a predetermined value.

It is another object of the present invention to provide the structure of a solder bump for connection which does not hinder the high integration of a package substrate while achieving the above task. For this purpose, a structure in which a cap portion of the upper layer spreads out sideways only at the minimum and a producing method thereof are given.

BRIEF SUMMARY OF THE INVENTION

The invention of the present application forms a bump structured in double layers only on the surface of a chip and connects it to an electrode on the surface of a package substrate in soldering, but forming no solder bump on the surface of a package substrate as seen in conventional methods. The double-layer structure comprises a lower layer not fusing in the course of soldering shall have a composition capable of securing a definite distance H between the substrate and the chip. Its upper layer actually fuses in the course of soldering to electrically connect the bump to the electrode on the package substrate. At this time, the melting point of the lower layer is preferably at least 20° C. higher than that of the upper layer.

To be specific, the above task of the invention of the present application can be achieved with a bump which electrically connects a semiconductor substrate to a package substrate. The bump structure comprising a first part formed on said semiconductor chip and made of metal not to fuse in soldering; and a second part formed on said first part to fuse in soldering for electrical connection to said package substrate is described. To maintain the connection life, said first part has to have a definite height, whereas said second part to fuse in soldering has to have a definite volume to secure the electric connection. For this purpose, letting $H_1$, $V_1$, $H_2$ and $V_2$ be the height of the metal layer and the volume for the first part and the second part, respectively, the relations $H_1 > 30 \mu m$, $H_2 > 20 \mu m$, $H_1/H_2 = 0.3$ to $2$ and $V_2/V_1 > 1$ must be satisfied. Under these conditions, soldering is actually executed to preferably obtain $H = 60$ to $90 \mu m$.

BRIEF DESCRIPTION OF THE DRAWINGS

FIG. 3 is a structure drawing showing one embodiment of a solder bump structure according to the invention of the present application;

FIG. 4 is a sectional view showing the first production step of one embodiment of a solder bump structure according to the invention of the present application;

FIG. 5 is a sectional view showing the intermediate production step of one embodiment of a solder bump structure according to the invention of the present application;

FIG. 6 is a sectional view showing the semifinal production step of one embodiment of a solder bump structure according to the invention of the present application;

FIG. 7 is a structure drawing showing another embodiment of a solder bump structure according to the invention of the present application; and FIG. 8 is a sectional view showing one production step of another embodiment of a solder bump structure according to the invention of the present application.

DETAILED DESCRIPTION OF THE INVENTION

By forming a solder bump on a semiconductor chip alone, the step of forming a solder bump on the surface of a package substrate can be saved and therefore an increase in productivity can be expected. In addition, by making the structure of a solder bump into double-layer structure comprising a high-melting-point metal layer and a metal layer to actually fuse in soldering, the space H between the chip and the substrate can be kept large and consequently the connection life is extended. Furthermore, because the formed bump has its spherical tip, the tip need not be made into a spherical shape previously by reflow prior to soldering and this step can be omitted. By assuming a structure in which the part of a cap spreads out to the minimum extent, a high-density package becomes possible.

Figure 1A:
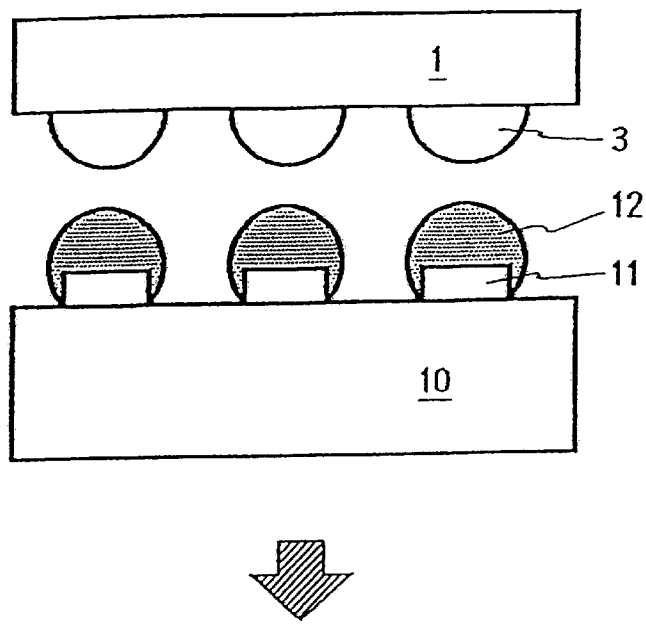
FIGS. 1a and 1b is an explanatory drawing showing the formation of a solder layer in a conventional flip chip technique.
Figure 1B:
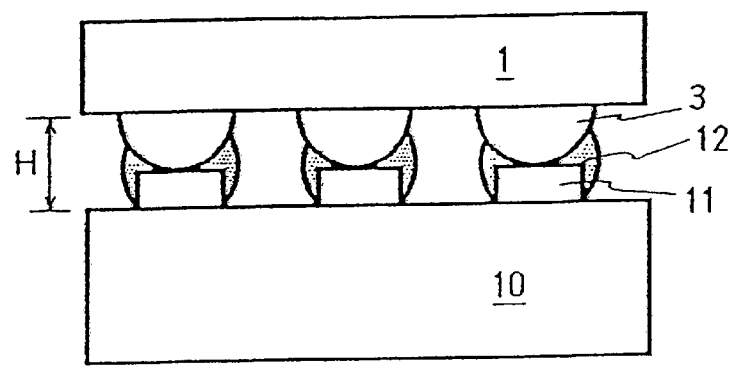
Figure 2A:
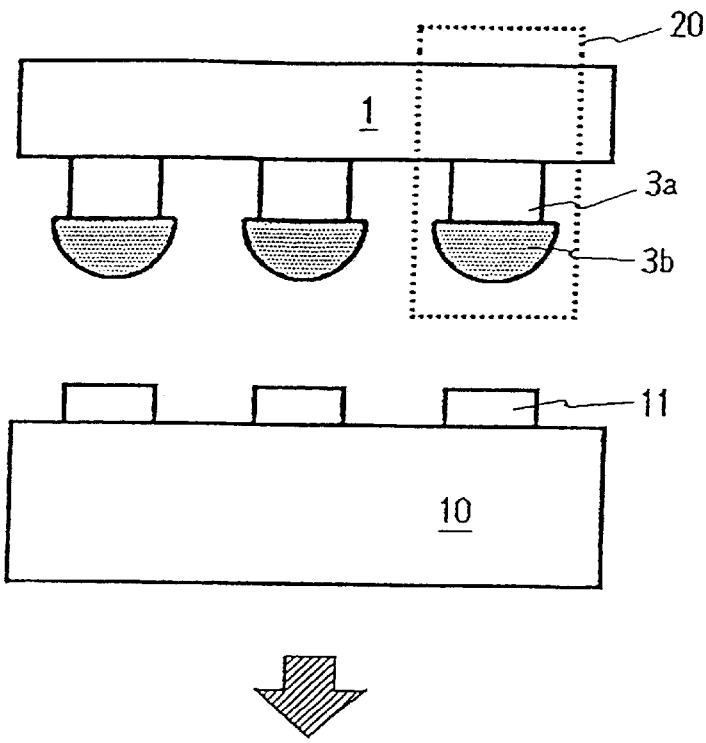
FIGS. 2a and 2b is a schematic illustration showing the connection using a solder bump structure according to the invention of the present application.

As shown in FIG. 2a, the invention of the present application forms a bump 20 comprising two layers, a lower layer 3a and an upper layer 3b. The upper solder layer 3b fuses in soldering, on the surface of a semiconductor chip 1 without the forming of any solder layer on an electrode 11 of a package substrate 10. A distance H between a substrate and a chip is maintained by a lower layer 3a not fusing in soldering, an upper layer 3b fusing in soldering, and an electrode 11 on the surface of a package substrate.

Figure 2B:
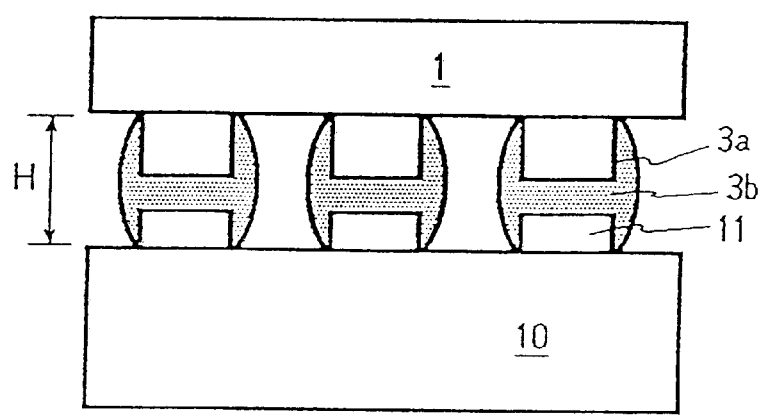

FIG. 2b shows a sectional view during the period of flip chip connection with a bump. Connection is made in such a manner that the upper-layer metal 3b fuses by reflow and coats an electrode 11 on the package substrate 10 and a lower-layer metal 3a on the semiconductor chip 1. At this time, because the lower-layer metal 3a does not fuse by reflow, a definite distance H is kept between the semiconductor chip 1 and the package substrate 10. Thus, maintaining of the connection life become possible.

In this manner, with the bump according to the invention of the present application, only the upper-layer metal fuses at the time of reflow. Accordingly, the melting point of the lower-layer metal has to be significantly higher than that of the upper-layer metal. From experiments, it is found that the difference in melting point should be at least more than 20° C. When the difference is less than 20° C., the lower-layer metal also fuses at the time of reflow and maintaining a necessary distance H between the semiconductor chip and the package substrate becomes impossible.

FIG. 3 shows the detailed structure of the bump 20 according to the invention of the present application. The lower layer 3a and the upper layer 3b constituting the bump 20 are formed on the semiconductor substrate 1 via an electrode 22 and a barrier metal 23, while the periphery of the bump is coated with an insulating layer 30. This embodiment is shaped so that the upper layer 3b forms a cap and spreads out over the lower layer 3a. In this manner, by spreading out the upper layer 3b, the amount of solder related to the upper layer can be made larger.

The upper-layer metal 3b is the portion that actually fuses in soldering. Thus, a low melting point solder compound is desirable for this portion. For example, there are two-component eutectic solders (63 wt. % tin, 37 wt. % lead) and three-component eutectic solders (40 wt. % indium, 40 wt. % tin, 20 wt. % lead containing indium which have desirable upper-layer metal melting points). (Additionally, there is also two-component eutectic solder containing indium, 52 wt. % indium—48 wt. % tin or 75 wt. % indium—25 wt. % lead which would be an appropriate upper-layer solder. The lower-layer metal 3a does not fuse in soldering and serves to maintain the distance H between the substrate and the chip. Thus, a metal of higher melting point than that of the upper layer 3b is desirable. For example, a high melting point solder (3 wt. % tin and 97 wt. % lead), or metals such as gold, copper, nickel or silver are suitable.

A method for forming such a bump will be described by referring to FIG. 4 and the following description. The oxide film is removed by the RF plasma etching process from the surface of an aluminum electrode 22 formed on the semiconductor substrate 1. Then, a metal film 23 composed of a plurality of layers is formed on the whole surface. This film operates as a common electrode in the plating which takes place later. This metal film 23 comprises Ti—Cu, Ti—Ni—Au, Ti—Pd—Au or the like. Next, as a mask for plating, a photoresist 24 is applied. Thereafter, at the predetermined bump location, an opening is provided in the photoresist and a lower-layer metal 25 is formed through plating to much the same thickness as that of the photoresist layer 24 by using the metal film as a common plating electrode as shown in FIG. 5. While the present invention can operate using known positive and negative photoresist techniques, it is preferred that a high resolution photoresist be used. The lower-layer metal 25 helps to maintain the distance H between the substrate and the metal. Furthermore, as shown in FIG. 6, by plating an upper-layer metal 26 on the lower-layer metal 25, a desired structure related to the invention of the present application is obtained. Thereafter, on removing the photoresist layer 24 and the metal film 23 by wet etching or the like, a bump 20 shown in FIG. 2 can be obtained.

Here, letting $H_1$, $V_1$, $H_2$ and $V_2$ be the height and the volume for the lower-layer metal and the upper-layer metal, respectively, the range of the preferred embodiment of the invention of the present application is as follows: $H_1 > 30 \mu m$, $H_2 > 20 \mu m$, $H_1/H_2 = 0.3$ to 2 and $V_2/V_1 > 1$. For example, when the photoresist is 50 $\mu m$ thick, the above amounts in one embodiment assume the following respective values:

$V_1$: $0.7 \times 10^{-4}$ (mm$^3$)

$V_2$: $3.0 \times 10^{-4}$ (mm$^3$)

$H_1$: 32 ($\mu m$) and $H_2$: 50 ($\mu m$), where $H_1/H_2 = 0.6$ and $V_2/V_1 = 4.3$.

For example, too large a value of $H_1/H_2$ creates a situation where the height $H_1$ of the lower-layer metal is extremely large, but a value of $H_1$ is limited because it is correlated to the thickness of the photoresist as mentioned above. On the contrary, if the value of $H_1/H_2$ is too small, the intention of the invention of the present application to maintain the distance H between the substrate and the chip is not fully reflected. When $V_2/V_1$ is too large, the fused amount of metal in soldering becomes so large as to make the soldering process unstable, and conversely, trouble becomes likely to occur in an electric connection when $V_2/V_1$ is too small.

With another embodiment, $V_1$: $1.0 \times 10^{-4}$ (mm$^3$)

$V_2$: $2.2 \times 10^{-4}$ (mm$^3$)

$H_1$: 50 ($\mu$m) and $H_2$: 27 ($\mu$m), where $H_1/H_2 = 1.9$ and $V_2/V_1 = 2.2$.

In either case, the distance H between the substrate and the chip after soldering ranges from 60 to 90 $\mu$m. As an experimental result, it has been found to be a necessary and sufficient conditions that $H_1 > 30$ $\mu$m, $H_2 > 20$ $\mu$m and $V_2/V_1 > 1$. It is H which is of ultimate concern for maintaining the connection life. $H > 60$ $\mu$m is needed for purposes of calculation. The above conditions for $H_1$ and $H_2$ are required to satisfy this minimum value.

Next, FIG. 7 shows one embodiment of the present invention in which the upper-layer metal does not spread out like a cap over the lower-layer metal. Also with this embodiment, a bump 20 comprising the lower-metal layer 3a and the upper-metal layer 3b are formed on the semiconductor substrate 1 of a chip, via an electrode 22 and a metal film 23, while the periphery of the bump 20 is coated with an insulating layer 30. This embodiment differs from the embodiment shown in FIG. 3 in that the upper-layer metal 3b has the same sectional area as with the lower-layer metal 3a. With such an aspect of bump, the horizontal (parallel with the substrate surface) consumed area is small and consequently a higher-density package substrate can be achieved.

A method for forming such an embodiment of bump is shown in FIG. 8, which illustrates the same steps as before showing the method for forming an embodiment having a cap. FIGS. 4 and 5 show a structure that is common for both embodiments. First, for this alternate embodiment, a thicker photoresist film than that needed for forming a cap shaped bump is required. In this case, the thickness of the photoresist film is preferably equal to or greater than 70 $\mu$m. And, the photoresist film is formed in such a manner that the surface of the lower-metal layer 27 is positioned lower than that of the photoresist to form an upper-metal layer 28. If a surface of the upper-metal layer 28 is lower than the surface of the photoresist 24 a capless bump shape is obtained. For forming this type of bump, it is required to set the thickness of the photoresist to a larger value than the previous embodiment. With an appropriate embodiment, the thickness of a photoresist film applied at that time is 100 $\mu$m or more.

Additionally, the invention of the present application is attainable also by forming a bump of similar structure on the surface of the package substrate. A solder bump is generally formed by the screen printing process, but a mask used in this process is expensive and a modification in specification is difficult. Thus, a bump formed on the surface of the semiconductor chip is a preferred embodiment.

Among the above parameters, $H_1$, $H_2$, $V_1$ and $V_2$, the factors essential in achieving a desired advantage of the invention of the present application are $H_1$ and $V_2/V_1$. First, $H_1$ is the thickness of the lower metal layer and affects the connection life of products. Thus, this thickness is required to be 30 $\mu$m at the minimum. On the other hand, when $H_1$ is large, there is an improvement in connection life, but a problem in manufacturing process exists in that the photoresist has to be applied thickly. In addition, when forming a lower-metal layer by plating, variation in height becomes more likely to occur, with an increasing value of $H_1$ and consequently a connection fault between the semiconductor chip and the package substrate becomes likely to occur. Considering these, a reasonable range of $H_1$ is as follows:

$$30 \ \mu m < H_1 < 90 \ \mu m \quad \text{(a)}$$

Next, the operating parameters concerning $V_2/V_1$ will be discussed. $V_2/V_1$ represents the volume ratio of the upper-layer metal to the lower-layer metal. When the volume of the upper-metal layer is too large, the fused amount of metal during reflow becomes too large and consequently there would be a concern that the reflow metal would overflow between a plurality of bumps causing an electric short circuit between the bumps. On the other hand, when $V_2/V_1$ is small, there is a possibility of insufficient connection in spite of execution of reflow. Considering these, a reasonable range of $V_2/V_1$ is as follows:

$$1 < V_2/V_1 < 5 \quad \text{(b)}$$

Among the parameters mentioned above, $H_2$ is relatively less determinative as a characteristic of a bump. However, $H_2$ correlates with $V_2/V_1$.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the claims.

What is claimed is:

1. A bump structure for electrically connecting a semiconductor chip to a package substrate, comprising:

a first part, having a height, $H_1$, a volume, $V_1$, and a first diameter and formed on said semiconductor chip and made of metal substantially incapable of melting at a predetermined soldering temperature; and a second part, having a height $H_2$, a volume $V_2$, a second diameter and formed on said first part and capable of melting at the predetermined soldering temperature for electrical connection to a package substrate, wherein the height $H_1$ of said first part satisfies the relation 90 $\mu$m > $H_1$ > 30 $\mu$m and wherein the first diameter is not equal to the second diameter.

2. The bump structure as set forth in claim 1, wherein said first part maintains the distance between said semiconductor chip and a package substrate equal to or more than a predetermined value.

3. A bump structure for electrically connecting a semiconductor chip to a package substrate, comprising:

a first part, having a height, $H_1$, a volume, $V_1$, and a first diameter and formed on said semiconductor chip and made of metal substantially incapable of melting at a predetermined soldering temperature; and a second part, having a height $H_2$, a volume $V_2$, and a second diameter and formed on said first part and capable of melting at the predetermined soldering temperature for electrical connection to a package substrate, wherein the first diameter is not equal to the second diameter and wherein the relation $5 > V_2/V_1 > 1$ is satisfied where $V_1$ and $V_2$ are the volume of said first part and volume of said second part respectively.

4. A bump structure for electrically connecting a semiconductor chip to a package substrate, comprising:

a first part, having a height, $H_1$, a volume, $V_1$, and a first diameter and formed on said semiconductor chip and made of metal substantially incapable of melting at a predetermined soldering temperature; and a second part, having a height $H_2$, a volume $V_2$, and a second diameter and formed on said first part and capable of melting at the predetermined soldering temperature for electrical connection to a package substrate and wherein the first diameter is not equal to the second diameter wherein said first part is made of metal having a melting point 20° C. higher than that of the composition of said second part.

5. A bump structure for electrically connecting a semiconductor chip to a package substrate, comprising:

a first part, having a height, $H_1$, a volume, $V_1$, and a first diameter and formed on said semiconductor chip and made of metal substantially incapable of melting at a predetermined soldering temperature; and a second part, having a height $H_2$, a volume $V_2$, and a second diameter and formed on said first part and capable of melting at the predetermined soldering temperature for electrical connection to a package substrate wherein the first diameter is not equal to the second diameter wherein said first part is made of a solder including 3% gold or tin by weight and 97% lead by weight.

6. The bump structure as set forth in claim 1, wherein said second part is made of a two-component system eutectic solder alloy.

7. The bump structure as set forth in claim 1, wherein said second part is made of a three-component system eutectic solder alloy containing indium.

8. A package connecting body for a semiconductor chip and a package substrate, comprising:

a first metal part formed on said semiconductor chip, said first metal part having a melting point;

a second metal part formed on said package substrate; and a third metal part, having a melting point lower than at least said first metal part melting point, having been formed on at least one of said first metal part and said second metal part and interposed at least partly between said first metal part and said second metal part for providing electrical connection therebetween, wherein the distance between said semiconductor chip and said package substrate, maintained by said first metal part, said second metal part and said third metal part is equal to or greater than 60 µm.

9. The bump structure as set forth in claim 1, wherein the height $H_1$ of said first part satisfies the relation 90 µm≧$H_1$>50 µm.

10. The bump structure as set forth in claim 9 wherein the height $H_2$ of said second part satisfies the relation that $H_1/H_2$ ranges from about 0.55 to about 2.

11. The bump structure as set forth in claim 1, wherein the relation 5>$V_2/V_1$>1.5 is satisfied where $V_1$ and $V_2$ are the volume of said first part and volume of said second part respectively.

12. The bump structure as set forth in claim 3, wherein said second part is made of a two-component system eutectic solder alloy.

13. The bump structure as set forth in claim 3, wherein said second part is made of a three-component system eutectic solder alloy containing indium.

14. The bump structure as set forth in claim 4, wherein said second part is made of a two-component system eutectic solder alloy.

15. The bump structure as set forth in claim 4, wherein said second part is made of a three-component system eutectic solder alloy containing indium.

16. The bump structure as set forth in claim 5, wherein said second part is made of a two-component system eutectic solder alloy.

17. The bump structure as set forth in claim 5, wherein said second part is made of a three-component system eutectic solder alloy containing indium.

\* \* \* \* \*